United States Patent
Nagata et al.

(10) Patent No.: US 6,239,656 B1
(45) Date of Patent: May 29, 2001

(54) POWER AMPLIFIER

(75) Inventors: Hideo Nagata, Ogasa-gun; Takashi Enoki, Yokohama, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/494,541

(22) Filed: Jan. 31, 2000

(51) Int. Cl.[7] .................................................. H03F 3/68
(52) U.S. Cl. ..................................... 330/124 R; 330/286
(58) Field of Search ............................... 330/53, 124 R, 330/286, 295

(56) References Cited

U.S. PATENT DOCUMENTS

| | | | |
|---|---|---|---|
| 4,392,252 | * 7/1983 | Cluniat | 455/116 |
| 4,439,740 | * 3/1984 | Harrington | 330/124 R |
| 4,564,816 | 1/1986 | Kumar et al. . | |
| 4,656,434 | * 4/1987 | Selin | 330/84 |
| 5,287,069 | * 2/1994 | Okubo et al. | 330/10 |
| 6,128,479 | * 10/2000 | Fitzpatrick et al. | 455/137 |

FOREIGN PATENT DOCUMENTS

| | | |
|---|---|---|
| 0936731A1 | 8/1999 | (EP) . |
| 4301905 | 10/1992 | (JP) . |
| 637551 | 2/1994 | (JP) . |

OTHER PUBLICATIONS

European Search Report dated Jun. 30, 2000.
Rodrigo Cordeiro Tupynamba et al., "MESFET Nonlinearities Applied to Predistortion Linearizer Design", International Microwave Symposium Digest (MTT-S), US, New York, IEEE, vol.—, 1992, pp. 955–958.

* cited by examiner

Primary Examiner—Robert Pascal
Assistant Examiner—Henry Choe
(74) Attorney, Agent, or Firm—Stevens, Davis, Miller & Mosher, LLP

(57) ABSTRACT

The present invention is a microwave power amplifier using a balanced amplifier. The present invention uses one output port of a hybrid power combiner as a port to detect distortion of the amplifier circuit. To eliminate noise superimposed over a normal signal, the detected distortion is fed forward to the normal amplified signal via an adjustment circuit and directional coupler.

10 Claims, 6 Drawing Sheets

A: ROUTE OF SIGNAL OF SAME PHASE
B: ROUTE OF SIGNAL WITH 90° PHASE SHIFT
C: ROUTE OF SIGNAL WITH 90° PHASE SHIFT
D: ROUTE OF SIGNAL WITH 90° PHASE SHIFT
E: ROUTE OF SIGNAL OF SAME PHASE
F: ROUTE OF SIGNAL OF SAME PHASE

A: ROUTE OF SIGNAL OF SAME PHASE
B: ROUTE OF SIGNAL WITH 90° PHASE SHIFT
C: ROUTE OF SIGNAL WITH 90° PHASE SHIFT
D: ROUTE OF SIGNAL WITH 90° PHASE SHIFT
E: ROUTE OF SIGNAL OF SAME PHASE
F: ROUTE OF SIGNAL OF SAME PHASE

A: ROUTE OF SIGNAL OF SAME PHASE
B: ROUTE OF SIGNAL WITH 90° PHASE SHIFT
C: ROUTE OF SIGNAL WITH 90° PHASE SHIFT
D: ROUTE OF SIGNAL WITH 90° PHASE SHIFT
E: ROUTE OF SIGNAL OF SAME PHASE
F: ROUTE OF SIGNAL OF SAME PHASE

POWER AMPLIFIER

BACKGROUND OF THE INVENTION

1. Field of the Invention

The present invention relates to a power amplifier, and a microwave power amplifier with a non-linear distortion compensation function in particular.;

2. Description of the Related Art

In line with development of increasingly smaller and lighter cellular telephones in recent years, an IC supply voltage has been reduced and increasingly lower power consumption is required. As an IC supply voltage decreases, transistors composing a power amplifier become saturated more easily. Thus, the amount of noise superimposed over an amplified output signal tends to increase.

However, in order to meet stringent requirements from users, optimal communications using cellular telephones must be secured even in a low power consumption environment.

In securing the communication quality, it is important to compensate non-linear distortion of a microwave power amplifier. An example of non-linear distortion compensation circuit of a power amplifier is described in the Japanese Patent Application No.HEI 6-37551.

Suppressing non-linear distortion of the microwave power amplifier requires extraction of a distortion component signal in the first place. Then, the phase of the extracted distortion component signal is inverted. The inverted signal is superimposed over the original signal to cancel out the distortion component.

However, separating only the distortion component from the output signal of the power amplifier requires a dedicated distortion extraction circuit, which will require more circuit parts. This may increase the cost of the apparatus.

This also requires prior fine adjustment of added circuit parts. Such adjustment is troublesome.

SUMMARY OF THE INVENTION

It is an objective of the present invention to reduce distortion of a microwave power amplifier while suppressing an increase in the number of parts of the circuit and avoiding trouble of prior adjustment of the circuit.

The present invention uses a balanced amplifier comprising a hybrid power divider and hybrid power combiner for power amplification. The present invention actively uses one port (terminal) of the hybrid power combiner, which would normally be terminated, as a distortion detection port (terminal).

That is, output ports other than the output ports for normal signals in the balanced amplifier circuit would conventionally be terminated with terminal resistors connected. However, these ports have the feature that a distortion component generated in the amplifier is outputted to these ports without being suppressed so much as a normal signal.

Focusing on this finding, it is possible to extract distortion by using one port of the hybrid power combiner that would conventionally be terminated as a distortion detection port without using any special circuit. Adding desired adjustment to the output of this port and feeding this output forward to the output of the power amplifier can cancel out the distortion component, thus eliminating the distortion component.

It is desirable that the distortion signal outputted from one port of the hybrid power combiner be subjected to adjustment of attenuation of the signal level, phase shift or amplitude. This will enhance the distortion elimination effects.

Mounting the power amplifier of the present invention in a mobile communication apparatus can secure a clear communication quality with less distortion.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

With reference now to the attached drawings, the embodiments of the present invention are explained below.

Figure 3A:
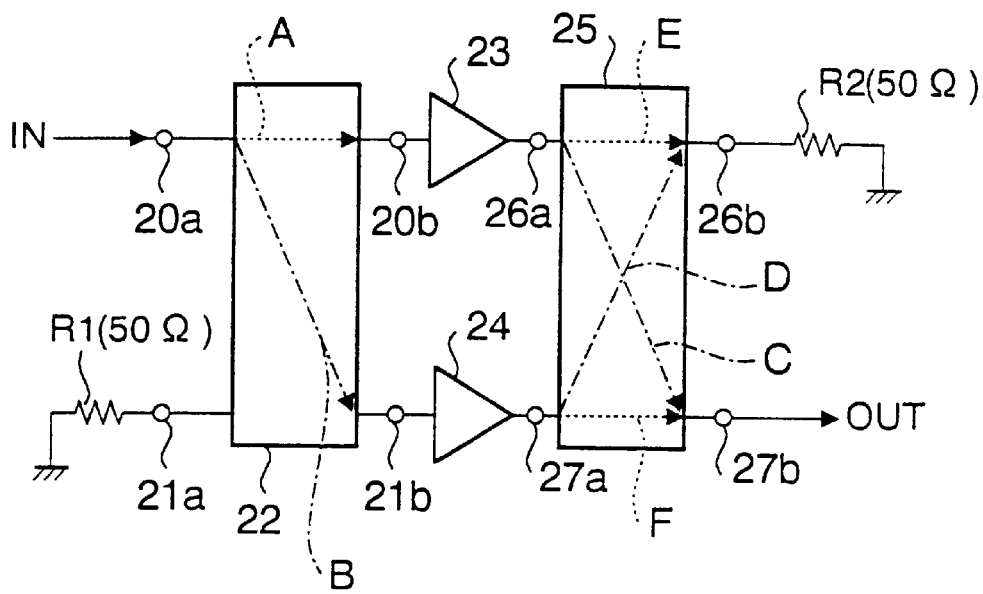
FIG. 3A is a diagram showing a general configuration of a hybrid balanced power amplifier.
Figure 3B:
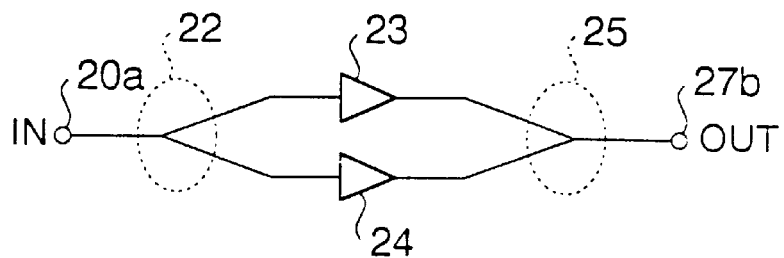
FIG. 3B is a diagram showing an equivalent circuit of a general hybrid balanced amplifier.

Before giving specific explanations of the embodiments, the configuration of a balanced amplifier and typical operation method (conventional operation method) are explained using FIG. 3A and FIG. 3B.

FIG. 3A is a diagram showing a basic configuration of the balanced amplifier and FIG. 3B is an equivalent circuit diagram of the balanced amplifier.

As shown in FIG. 3B, the balanced amplifier divides a signal (IN) inputted to input terminal 20a into two parts by power divider 22 and amplifies the two divided signals by two amplifier circuits 23 and 24 and then combines the two amplified signals by power combiner 25 and obtains an amplified output signal (OUT) from output terminal 27b.

According to this configuration, the input signal is divided into two parts and the power of the signal is reduced to ½, and thus the load on each amplifier circuit (23, 24) is alleviated compared to the case of amplification using one amplifier.

That is, transistors are less likely to become saturated, and thus it is easier to secure the linearity. Furthermore, since the amount of load on one amplifier circuit is reduced, this configuration has a merit of obtaining desired performance even using a low-priced circuit.

More specifically, the balanced amplifier has a configuration as shown in FIG. 3A. Both power divider 22 and power combiner 25 have a hybrid configuration with 2 inputs and 2 outputs.

Here, a hybrid configuration refers to a configuration with 4 terminals (ports) used for the purpose of dividing an input signal into 2 signals or combining 2 signals into one signal.

In FIG. 3A, the input signal (IN) is inputted to one input port 20a of hybrid power divider 22. 50Ω terminal resistor R1 is connected to other input terminal 21a of power divider 22 to adjust impedance.

The signal (IN) inputted to input port 20a is divided into two parts. The divided signals are outputted from output ports 20b and 21b via two routes "A" and "B", respectively.

At this time, the phase of the signal outputted from output port 20b via route "A" is the same as that of the input signal (IN), while the phase of the signal outputted from output port 21b via route "B" is shifted by 90° from the phase of the input signal (IN).

The signals outputted from output ports 20b and 21b of power divider 22 are amplified by amplifier circuits 23 and 24, respectively. The outputs of the amplifiers are then inputted to input ports 26a and 27a of hybrid power combiner 25.

Hybrid power combiner 25 combines the two signals inputted and outputs an amplified signal (normal signal OUT) from output port 27b. 50 Ω terminal resistor R2 is connected to other output port 26b. Thus, no normal signal is outputted from this output port 26b.

That is, with hybrid power combiner 25, a signal inputted to input port 26a is divided into two output ports 26b and 27b via route "C" and route "E".

Likewise, a signal inputted to input port 27a is divided into two output ports 26b and 27b via route "D" and route "F".

At this time, the phase of the signal outputted via route "C" and route "D" is shifted by 90° from the phase of the input signal. On the other hand, the phase of the signal outputted via route "E" and route "F" is the same phase as that of the input signal.

Here, if attention is given to output port 26b, the signal appearing at this port is a signal combining the signal coming via route "A" of power divider 22, amplifier circuit 23 and route "E" of power combiner 25 and the signal coming via route "B" of power divider 22, amplifier circuit 24 and route "D" of power combiner 25.

The signal coming via route "B" of power divider 22 and the signal coming via amplifier circuit 24 and route "D" of power combiner 25 are signals with the phase shifted by a total of 180° (=90°+90°) with respect to the input signal (IN). On the other hand, the signal coming via route "E" of power combiner 25 is a signal with the same phase as that of the input signal (IN).

That is, since one signal and another signal with an 180° phase shift with respect to the first one are added up, these two signals are canceled out and suppressed, and therefore no normal signal is outputted from output port 26b.

On the other hand, if attention is given to output port 27b of power combiner 25, the signal appearing at this port is a signal combining the signal coming via route "B" of power divider 22, amplifier circuit 24 and route "F" of power combiner 25 and the signal coming via route "A" of power divider 22, amplifier 23 and route "C" of power combiner 25.

Here, the signal coming via route "B" of power divider 22, amplifier circuit 24 and route "F" of power combiner 25 is a signal with the phase shifted by 90° with respect to the input signal (IN). On the other hand, the signal coming via route "A" of power divider 22, amplifier 23 and route "C" of power combiner 25 is likewise a signal with the phase shifted by 90° with respect to the input signal (IN).

That is, two signals with a 90° phase shift with respect to the input signal (IN) (that is, signals with the same phase) are added up. Therefore, an amplified normal signal (OUT) is outputted from output port 27b.

This is the basic operation of the balanced amplifier.

(Embodiment 1)

Figure 1:
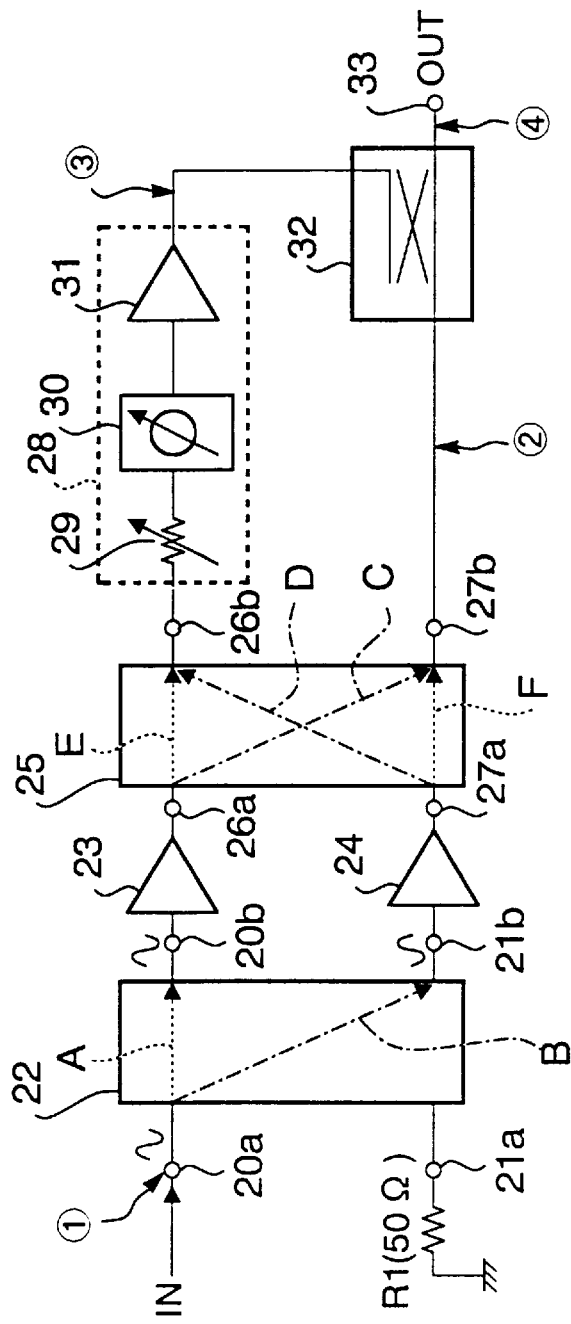
FIG. 1 is a circuit diagram showing a configuration of a hybrid balanced power amplifier according to an embodiment of the present invention.

FIG. 1 is a circuit diagram showing a configuration of a microwave power amplifier with a distortion compensation function of the present invention.

As illustrated in the figure, the power amplifier of the present invention amplifies a microwave signal using a balanced amplifier with 2 inputs and 2 outputs. However, the balanced amplifier used has an operating mode different from that of the general one shown in FIG. 3A.

That is, the balanced amplifier shown in FIG. 1 uses output port 26b that would originally be terminated as a port to detect distortion generated in amplifier circuits 23 and 24. As illustrated in the figure, adjustment circuit 28 is connected to output port 26b.

Adjustment circuit 28 comprises level adjustment circuit 29, phase adjustment circuit 30 and amplifier circuit 31. The output of adjustment circuit 28 is fed forward to the normal signal obtained from output port 27b via directional coupler 32. This eliminates distortion superimposed over the normal signal.

As shown above, the present embodiment is characterized by the use of output port 26b (FIG. 3A) of power combiner 25 that would conventionally be terminated as a distortion detection port of amplifier circuits 23 and 24.

This is further explained below:

Non-linear distortion questioned here is generated in amplifier circuits 23 and 24. In other words, no distortion exists on the signal route up to amplifier circuits 23 and 24.

Consider here how signal distortion generated in amplifier circuits 23 and 24 is reflected in output port 26b of power combiner 25.

Signal distortion (noise) generated in amplifier circuit 23 reaches output port 26b via input port 26a of power combiner 25 and route "E" without any phase shift.

On the other hand, distortion (noise) generated in amplifier circuit 24 reaches output port 26b via input port 27a of power combiner 25 and route "D" with a phase shift of 90° and is combined with the signal coming via route "E". The phase difference between these two signals is 90°.

As shown above, in the case of a normal signal (main signal), since two signals with a phase difference of 180° are combined by means of the function of the balanced circuit, the combined signal is strongly suppressed and not outputted from output port 26b.

However, in the case of noise generated in amplifier circuits 23 and 24, the phase difference between the signals to be combined is only 90°, the noise signal is suppressed not so much as the normal signal (main signal). Therefore, only the distortion component signal (distortion signal) is outputted from output port 26b.

This means that in FIG. 3A, output port 26b of power combiner 25 that would conventionally be terminated has a function as the port for detecting distortion signals of amplifiers 23 and 24.

The present embodiment uses this new finding to simplify the configuration of the distortion detection circuit performing distortion detection without providing any special configuration and save time and trouble of prior adjustment for distortion detection.

The configuration and operation of the distortion compensation circuit according to the present embodiment are explained below more specifically with reference to FIG. 1.

The balanced amplifier shown in the first stage in FIG. 1 is the same as that explained in FIG. 3A. The same components as those in FIG. 3A are assigned the same reference symbols.

Adjustment circuit 28 comprising variable attenuator 29, phase shifter 30 and amplifier circuit 31 is connected to output port 26b of power combiner 25 that composes the balanced amplifier. Phase shifter 30 inverts the phase of a distortion signal.

This adjustment circuit 28 is provided to adjust the level and phase of a distortion signal outputted from output port 26b of power combiner 25, that is, the port for distortion detection.

The distortion signal whose amplitude and phase have been adjusted by adjustment circuit 28 is added via directional coupler 32 to a normal signal outputted from output port 27b of power combiner 25. At this time, the distortion signal to be added is a signal with a phase shifted by 180° from that of the normal signal (signal with an opposite phase).

In this way, the distortion signal superimposed over the normal signal is canceled out and distortion is eliminated.

The operation above is explained using frequency spectra ① to ④ shown in FIG. 2A to FIG. 2D.

Figure 2A:
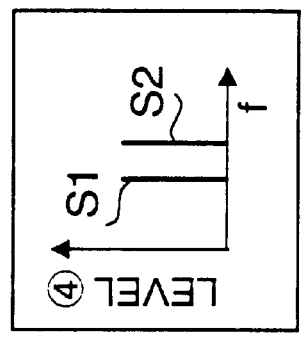
FIG. 2A is a diagram showing a frequency spectrum of a signal in signal transmission route ① of the power amplifier in FIG. 1.

Frequency spectrum ① shown in FIG. 2A is the spectrum of the signal at input terminal 20a in FIG. 1.

Figure 2B:
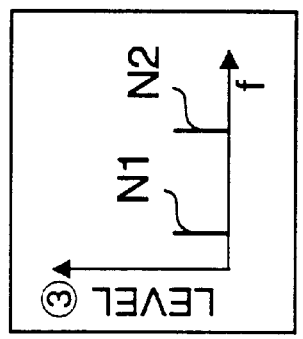
FIG. 2B is a diagram showing a frequency spectrum of a signal in signal transmission route ② of the power amplifier in FIG. 1.

Frequency spectrum ② shown in FIG. 2B is the spectrum of the signal at output terminal 27b in FIG. 1.

Figure 2C:
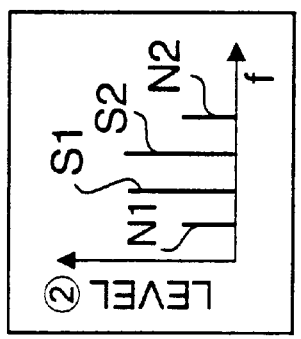
FIG. 2C is a diagram showing a frequency spectrum of a signal in signal transmission route ③ of the power amplifier in FIG. 1.

Frequency spectrum ③ shown in FIG. 2C is the spectrum of the signal at the output end of adjustment circuit 28 in FIG. 1.

Figure 2D:
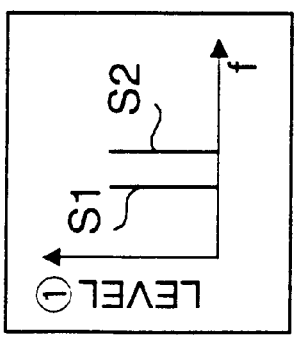
FIG. 2D is a diagram showing a frequency spectrum of a signal in signal transmission route ④ of the power amplifier in FIG. 1.

Frequency spectrum ④ shown in FIG. 2D is the spectrum of the signal at the output end of output terminal 33 in FIG. 1.

Here, suppose a case where two normal signals S1 and S2 with different frequencies are inputted to microwave power amplifier 6.

When these input signals pass through the balanced amplifier, distortion components N1 and N2 are generated due to the non-linearity of amplifier circuits 23 and 24 as shown in FIG. 2B. These distortion components N1 and N2 act as mixers as the characteristics of amplifier circuits 23 and 24 deteriorate and are tertiary distortion (harmonic distortion) generated by mixing of normal signals S1 and S2.

On the other hand, distortion components N1 and N2 outputted from output port 26b of power combiner 25 are subjected to processing such as attenuation, phase shift or amplification as required and their levels, etc. are adjusted (FIG. 2C).

After the phases of these distortion signals N1 and N2 are inverted, N1 and N2 are added to the output signal (FIG. 2B) of port 27b of power combiner 25 via directional coupler 32. This results in normal signals S1 and S2 free of distortion as shown in FIG. 2D.

The present embodiment uses output terminal 26b of the balanced amplifier that conventionally would not be used as a distortion signal terminal, thus eliminating the need for a special circuit to extract distortion. Therefore, the present embodiment simplifies the configuration, and therefore is also suitable for a small-sized communication apparatus such as a cellular telephone.

Since the present embodiment requires no special circuit, it is naturally not necessary to adjust the characteristic of such a circuit beforehand.

Figure 6:
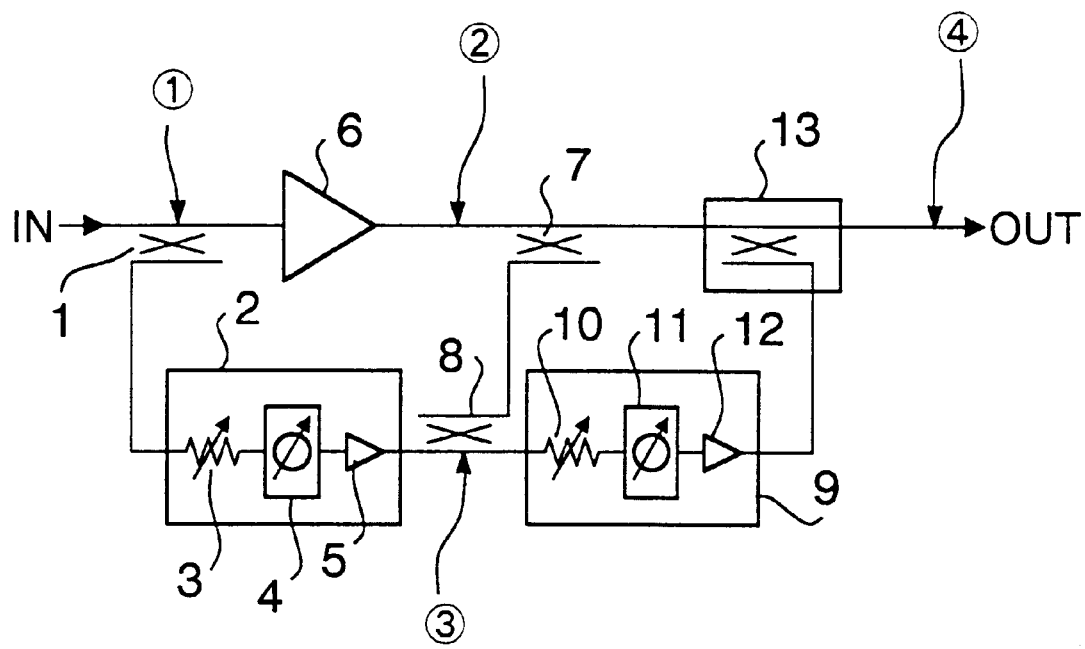
FIG. 6 is a circuit diagram showing a configuration of a comparison example of hybrid balanced power amplifier.
Figure 7D:
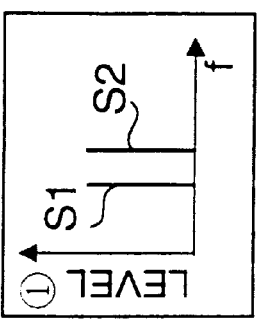
FIG. 7D is a diagram sowing a frequency spectrum of a signal in signal transmission route ④ of the hybrid balanced power amplifier in FIG. 6.
Figure 7C:
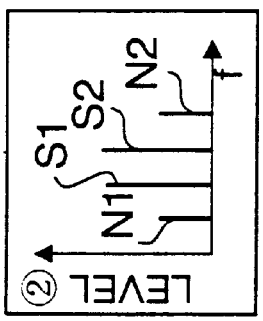
FIG. 7C is a diagram sowing a frequency spectrum of a signal in signal transmission route ③ of the hybrid balanced power amplifier in FIG. 6.
Figure 7B:
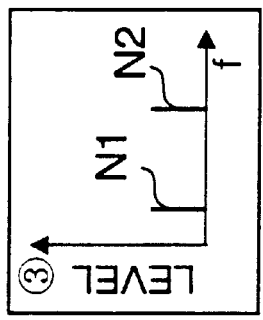
FIG. 7B is a diagram sowing a frequency spectrum of a signal in signal transmission route ② of the hybrid balanced power amplifier in FIG. 6.
Figure 7A:
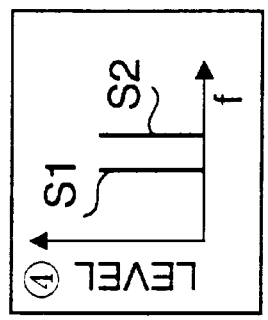
FIG. 7A is a diagram sowing a frequency spectrum of a signal in signal transmission route ① of the hybrid balanced power amplifier in FIG. 6.

FIG. 6 shows a comparable circuit example (circuit described in the Japanese Patent Application No.HEI 6-37551) that does not use the present invention.

In FIG. 6, microwave power amplifier 6 actually consists of a plurality of balanced amplifiers made up of a hybrid power divider and hybrid power combiner.

Figure 8:
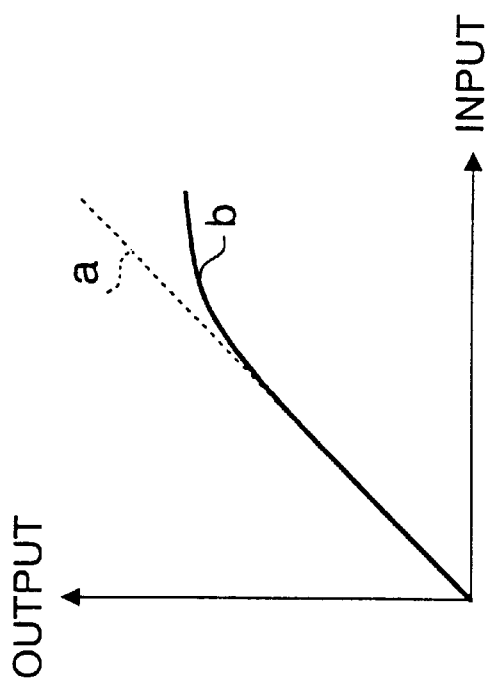
FIG. 8 is a characteristic diagram to explain non-linear distortion of a power amplifier circuit.

As characteristic b shown by the solid line in FIG. 8, this microwave power amplifier 6 has an input/output characteristic that becomes saturated in a high input area and is likely to generate non-linear distortion. In FIG. 8, characteristic a shown by the dotted line represents an ideal characteristic.

Therefore, the circuit in FIG. 6 is provided with directional couplers 1, 7 and 8, a distortion extraction section made up of first adjustment circuit 2 that adjusts the signal level and phase and second adjustment circuit 9 that adjusts the level and phase, etc. of the extracted distortion signal.

The output of second adjustment circuit 9 is fed forward to the output signal of power amplifier 6 via directional coupler 13, thereby eliminating non-linear distortion of power amplifier 6.

Frequency spectra of signals in different parts ① to ④ in FIG. 6 are shown in FIG. 7A to FIG. 7D, respectively.

The circuit of the present invention shown in FIG. 1 does not require a special circuit to detect distortion signals such as the conventional circuit in FIG. 6. That is, the circuit of the present invention does not require directional couplers 1, 7 and 8 and adjustment circuit 2. Therefore, the present invention has a simple configuration and is also suitable for miniaturization of a communication apparatus such as a cellular telephone.

The present invention also effectively and reliably detects noise using the intrinsic characteristic of a balanced amplifier that noise generated in an amplifier circuit is suppressed by the balanced amplifier not so effectively as a normal signal. Therefore, the present invention does not require prior adjustment of the characteristic by adjustment circuit 2 as in the case of the conventional circuit in FIG. 6, thus simplifying adjustment of the circuit.

Embodiment 2

Figure 4:
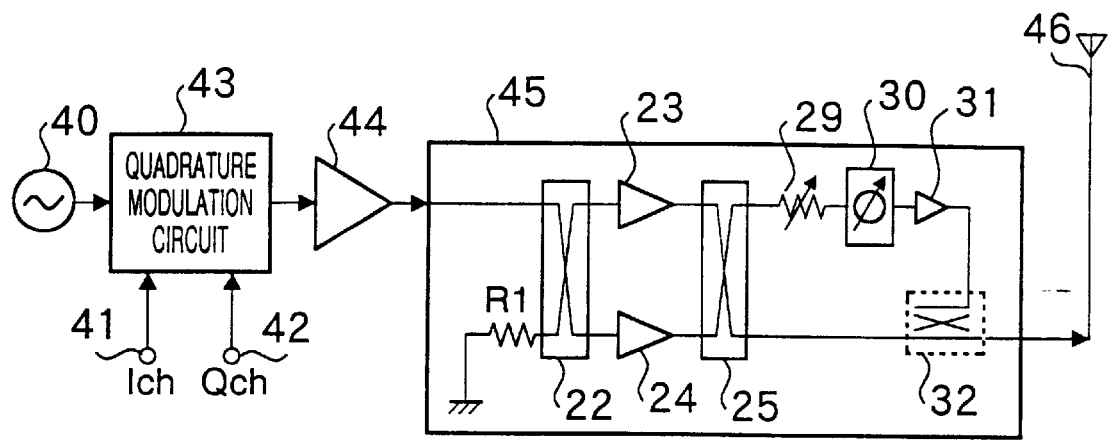
FIG. 4 is a circuit diagram showing a configuration of a transmitter according to another embodiment of the present invention.

FIG. 4 is a block diagram showing a configuration of a transmission circuit of Embodiment 2 of the present invention.

This transmission circuit comprises local oscillator 40, quadrature modulation circuit 43, pre-amplifier 44, balanced amplifier 45 explained in Embodiment 1 and antenna 46. Two signals (that is, I signal and Q signal) with a phase difference of 90° are inputted to quadrature modulation circuit 43 via two signal input terminals 41 and 42.

Balanced amplifier 45 can extract distortion signals without using any special distortion detection circuit. Balanced amplifier 45 is therefore suitable for miniaturization and low-cost implementation of a transmitter. Moreover, balanced amplifier 45 in FIG. 4 has a feed-forward type configuration. That is, distortion of amplifier circuits 23 and 24 is fed forward to circuits placed after amplifier circuits 23 and 24 to cancel out distortion. Thus, the amplified signal of the balanced amplifier is directly output to antenna 46, which is advantageous to achieving high efficiency and low distortion.

Embodiment 3

Figure 5:
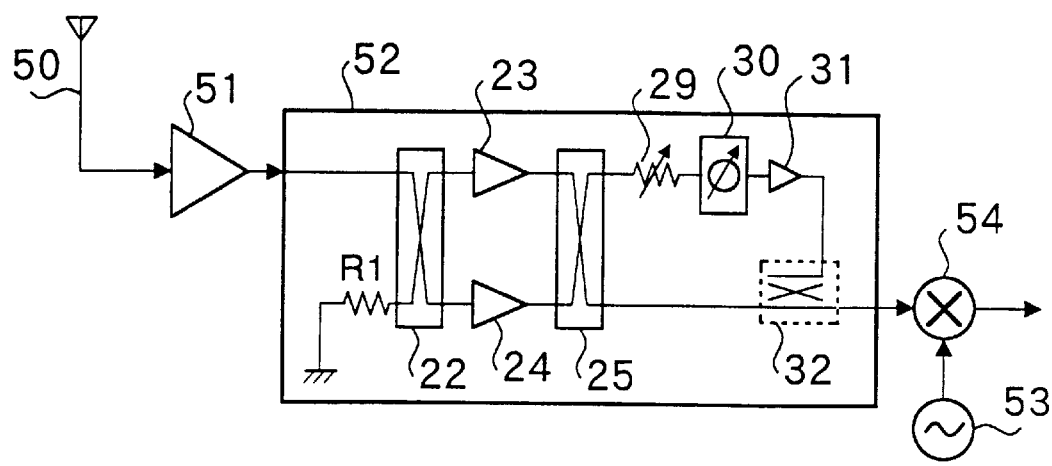
FIG. 5 is a circuit diagram showing a configuration of a receiver according to the other embodiment of the present invention.

FIG. 5 is a circuit diagram showing a configuration of a reception circuit according to Embodiment 3 of the present invention.

This reception circuit comprises antenna 50, low-noise amplifier 51, compensation circuit 52 using the balanced amplifier explained in Embodiment 1, down-converter 54 and local oscillator 53.

The reception amplifier directly connected to antenna 50 is required to have low noise and low power consumption to amplify a high power signal received. However, these are characteristics basically contradictory to each other and it is quite difficult to implement both low noise and low power consumption under severe low cost and miniaturization requirements.

However the balanced amplifier of the present invention has a distortion compensation function, which improves an S/N ratio of an amplified signal. Furthermore, the present invention cancels out distortion using the characteristic of the balanced amplifier, which simplifies the configuration and is therefore suitable for miniaturization and low-cost implementation of a communication apparatus.

Moreover, as shown in FIG. 5, balanced amplifier 52 is placed before down-converter 54, which allows the part with large reception power to amplify a normal reception signal. This has a merit of suppressing noise and easily improving the S/N ratio.

As explained above, the present invention uses one of ports of the power combiner as the one for detecting distortion generated in the amplifier circuit. This makes it possible to implement a small and high-performance balanced amplifier with a distortion compensation function. The present invention also requires no prior circuit adjustment for distortion detection.

The present invention is not limited to the above described embodiments, and various variations and modifications may be possible without departing from the scope of the present invention.

This application is based on the Japanese Patent Application No.HEI10-234581 filed on Aug. 20, 1998, entire content of which is expressly incorporated by reference herein.

What is claimed is:

1. A power amplifier circuit equipped with a compensation circuit comprising:
   a hybrid power divider;
   a hybrid power combiner;
   at least one amplifier provided between said hybrid power divider and said hybrid power combiner;
   an adjustment circuit that carries out a phase adjustment on a distortion signal outputted from an output port other than the output port of a normal signal of said hybrid power combiner; and
   a feedforward circuit that feeds forward the output of said adjustment circuit to the normal signal outputted from the output port of said normal signal of said hybrid power combiner.

2. A power amplifier circuit equipped with a compensation circuit comprising:
   a hybrid power divider;
   a hybrid power combiner;
   at least one amplifier provided between said hybrid power divider and said hybrid power combiner;
   an adjustment circuit that carries out predetermined processing on a distortion signal outputted from an output port other than the output port of a normal signal of said hybrid power combiner; and
   a feedforward circuit that feeds forward the output of said adjustment circuit to the normal signal outputted from the output port of said normal signal of said hybrid power combiner, wherein said adjustment circuit further comprises a variable attenuator, phase shifter and amplifier circuit.

3. A power amplifier circuit equipped with a compensation circuit comprising:
   a hybrid power divider;
   a hybrid power combiner;
   an adjustment circuit that carries out a phase adjustment on a distortion signal outputted from an output port other than the output port of a normal signal of said hybrid power combiner; and
   a feedforward circuit that feeds forward the output of said adjustment circuit to the normal signal outputted from the output port of said normal signal of said hybrid power combiner, wherein said hybrid power divider further comprises a first input port to which an input signal is supplied, second input port to which a terminal resistor is connected and first and second output ports, said hybrid power combiner further comprises first and second input ports, a first output port that functions as a distortion detection port and a second output port that functions as an output port of a normal signal,
   a first amplifier circuit is connected between said first output port of said hybrid power divider and said first input port of said hybrid power combiner, and
   a second amplifier circuit is connected between said second output port of said hybrid power divider and said second input port of said hybrid power combiner.

4. A transmitter comprising the power amplifier circuit according to claim 1.

5. A receiver comprising the power amplifier circuit according to claim 1.

6. A power amplifier circuit equipped with a compensation circuit comprising:
   a hybrid power divider;
   a hybrid power combiner;
   at least one amplifier provided between said hybrid power divider and said hybrid power combiner;
   an adjustment circuit that carries out a phase adjustment and an amplitude adjustment on a distortion signal outputted from an output port other than the output port of a normal signal of said hybrid power combiner; and a feedforward circuit that feeds forward the output of said adjustment circuit to the normal signal outputted from the output port of said normal signal of said hybrid power combiner.

7. A power amplifier circuit equipped with a compensation circuit comprising:

a hybrid power divider;

a hybrid power combiner;

at least one amplifier provided between said hybrid power divider and said hybrid power combiner;

an adjustment circuit which carries out a phase adjustment and an amplitude adjustment on a distortion signal outputted from an output port other than the output port of a normal signal of said hybrid power combiner, and which comprises a variable attenuator, phase shifter and amplifier circuit; and a feedforward circuit that feeds forward the output of said adjustment circuit to the normal signal outputted from the output port of said normal signal of said hybrid power combiner.

8. A power amplifier circuit equipped with a compensation circuit comprising:

a hybrid power divider having a first input port to which an input signal is supplied, second input port to which a terminal resistor is connected and first and second output ports;

a hybrid power combiner having first and second input ports, a first output port that functions as a distortion detection port and a second output port that functions as an output port of a normal signal;

a first amplifier circuit that is connected between said first output port of said hybrid power divider and said first input port of said hybrid power combiner;

a second amplifier circuit that is connected between said second output port of said hybrid power divider and said second input port of said hybrid power combiner;

an adjustment circuit that carries out a phase adjustment on a distortion signal outputted from said first output port of said hybrid power combiner; and a feedforward circuit that feeds forward the output of said adjustment circuit to the normal signal outputted from the second output port of said hybrid power combiner.

9. A transmitter provided with the power amplifier circuit according to claim 8.

10. A receiver provided with the power amplifier circuit according to claim 8.

* * * * *